(12) United States Patent
Yabuuchi

(10) Patent No.: US 9,935,105 B2
(45) Date of Patent: Apr. 3, 2018

(54) SEMICONDUCTOR DEVICE

(71) Applicant: Renesas Electronics Corporation, Koutou-ku, Tokyo (JP)

(72) Inventor: Makoto Yabuuchi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/607,599

(22) Filed: May 29, 2017

(65) Prior Publication Data

US 2017/0263605 A1    Sep. 14, 2017

Related U.S. Application Data

(63) Continuation of application No. 15/211,298, filed on Jul. 15, 2016, now Pat. No. 9,685,205.

(30) Foreign Application Priority Data

Sep. 11, 2015  (JP) .................................. 2015-179439

(51) Int. Cl.
| | | |
|---|---|---|
| *G11C 7/00* | (2006.01) | |
| *H01L 27/088* | (2006.01) | |
| *G11C 7/10* | (2006.01) | |
| *H01L 27/06* | (2006.01) | |
| *H01L 27/02* | (2006.01) | |

(52) U.S. Cl.
CPC ........ *H01L 27/0886* (2013.01); *G11C 7/1084* (2013.01); *G11C 7/1087* (2013.01); *G11C 7/1093* (2013.01); *H01L 27/0207* (2013.01); *H01L 27/0629* (2013.01)

(58) Field of Classification Search
CPC ............................ G11C 7/1084; G11C 7/1087
USPC ....................................................... 365/189.05
See application file for complete search history.

(56) References Cited

U.S. PATENT DOCUMENTS

| | | | | |
|---|---|---|---|---|
| 9,685,205 B2 * | 6/2017 | Yabuuchi | ................. | G11C 7/10 |
| 2008/0002454 A1 * | 1/2008 | Inoue | ....................... | G11C 7/12 365/104 |
| 2015/0189214 A1 | 7/2015 | Kurose | | |

FOREIGN PATENT DOCUMENTS

JP    H7-66293 A    3/1995

* cited by examiner

*Primary Examiner* — Hoai V Ho
(74) *Attorney, Agent, or Firm* — Shapiro, Gabor and Rosenberger, PLLC

(57) ABSTRACT

Data hold time is controlled without excessively increasing a circuit area. A semiconductor device includes a data buffer and a flip-flop formed of fin. As a delay line, gate wirings being in the same layer as gate electrodes of the fin are provided in a data signal path from a data output node of the data buffer to a data input node of the flip-flop.

11 Claims, 12 Drawing Sheets

FIG. 9

| | SETUP TIME | | | | HOLD TIME | | | |
|---|---|---|---|---|---|---|---|---|
| | MAX CONDITION | | | | MAX CONDITION | | MIN CONDITION | |
| | WITHOUT DELAY LINE | WITH DELAY LINE | | | WITHOUT DELAY LINE | WITH DELAY LINE | WITHOUT DELAY LINE | WITH DELAY LINE |
| CLOCK PATH DELAY (ns) | 225 | 225 | | | 247 | 247 | 130 | 130 |
| DATA PATH DELAY (ns) | 223 | 235.1 | | | 148 | 160.1 | 43.2 | 83.3 |
| DIFFERENCE (ns) | −2 | 10.1 | | | 99 | 86.9 | 86.8 (88%) | 46.7 (54%) |

SEMICONDUCTOR DEVICE

CROSS-REFERENCE TO RELATED APPLICATIONS

The disclosure of Japanese Patent Application No. 2015-179439 filed on Sep. 11, 2015 including the specification, drawings and abstract is incorporated herein by reference in its entirety.

BACKGROUND

The present invention relates to a semiconductor device and is suitably applicable to, for example, a semiconductor device using a fin type field-effect transistor (FET).

It is important to keep a setup time and a hold time of a data signal within predetermined ranges in a timing design of a semiconductor integrated circuit which operates synchronously with a clock. For this reason, in commonly used semiconductor integrated circuit, the timing is adjusted by providing a plurality of data buffers in series in a data signal line (for example, see Japanese Unexamined Patent Publication No. Hei 7(1995)-66293 [Patent Document 1]).

[Patent Document]

[Patent Document 1] Japanese Unexamined Patent Publication No. Hei 7(1995)-66293

SUMMARY

As miniaturization of the semiconductor integrated circuit progresses, an amount of delay in a clock signal line increases, bringing about a problem of an increase in data hold time in particular. Especially, in a semiconductor integrated circuit using a fin type FET (called a "fin FET"), an increase in the data hold time is prominent. To cope with this problem, when trying to adjust the delay amount of a data signal by providing a plurality of data buffers in series as in the past, numbers of data buffers are required, increasing a circuit area.

Other problems and novel features will be apparent from the description herein and accompanying drawings.

In one embodiment, a semiconductor device includes a data buffer and a flip-flop formed of fin FETs. For a delay line, gate wirings which are in the same layer as gate electrodes of the fin FET are provided in a path of the data signal from a data output node of the data buffer to a data input node of the flip-flop.

According to the above embodiment, the data hold time can be controlled without excessively increasing a circuit area.

BRIEF DESCRIPTION OF THE DRAWINGS

FIG. 9 shows, in tabular form, a simulation result of the data setup time and the data hold time;

DETAILED DESCRIPTION

Figure 1:
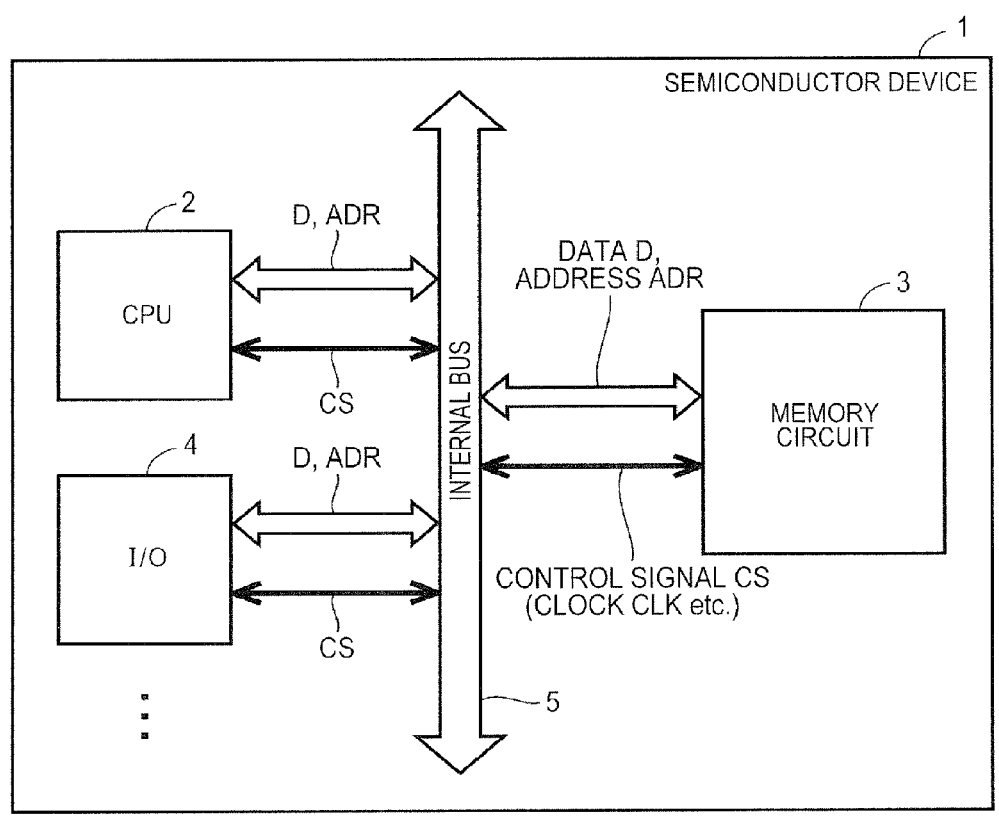
FIG. 1 is a block diagram showing a general configuration of a semiconductor device according to First Embodiment.

Now, referring to the drawings, each embodiment will be described in detail. Hereafter, a computer chip is shown as an example of a semiconductor device 1, and an input/output circuit in a memory unit thereof will be explained specifically. However, the following techniques are not limited to ones for the memory unit and, generally, they are widely applicable to semiconductor circuits which operate synchronously with clock signals.

In the drawings of each embodiment below, the same or corresponding parts may be denoted by the same reference characters, and the description thereof may not be repeated. In order to make the drawings intelligible, dimensional sizes in the plan view, cross-sectional views, and perspective view showing the configuration of the semiconductor device are not proportional to actual dimensional sizes in the semiconductor device.

First Embodiment

[General Configuration of Semiconductor Device]

FIG. 1 is a block diagram showing a general configuration of a semiconductor device according to First Embodiment. In FIG. 1, a microcomputer chip is shown as an example of the semiconductor device 1. Referring to FIG. 1, the semiconductor device 1 includes: a CPU (Central Processing Unit) 2; a memory circuit 3; an interface (I/O: Input and Output) circuit 4; other peripheral circuits (not shown); and an internal bus 5 for coupling those constituent elements.

The CPU 2 performs control of the whole semiconductor device 1 by operating according to a program. The memory circuit 3 functions as primary storages, such as a RAM (Random Access Memory) and a ROM (Read Only Memory). Although only one memory circuit 3 is shown as a typical example in FIG. 1, in fact, there are included several kinds of memory circuits such as a DRAM (Dynamic Random Access Memory), an SRAM (Static Random Access Memory), and a flash memory. The interface circuit 4 is used for an external coupling of the semiconductor device. These constituent elements exchange a data signal D, an address signal ADR, a control signal CS, etc. mutually through the internal bus 5.

[Configuration of Memory Circuit]

Figure 2:
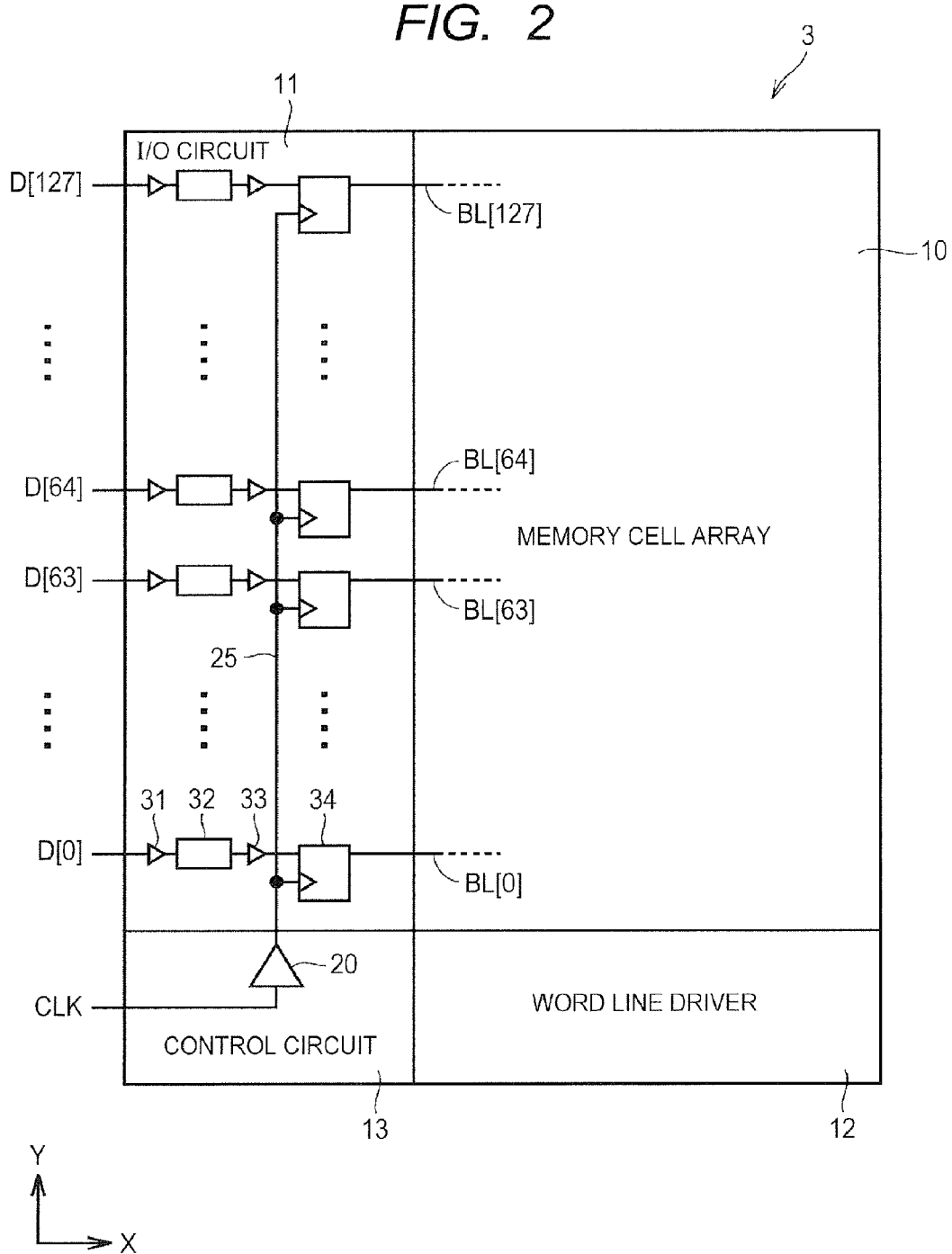
FIG. 2 is a block diagram showing a configuration of a memory circuit of FIG. 1.

FIG. 2 is a block diagram showing a configuration of the memory circuit of FIG. 1. Referring to FIG. 2, the memory circuit 3 includes: a memory cell array 10; an I/O circuit 11; a word line driver 12; and a control circuit 13. Each of the transistors forming the memory circuit 3 includes a fin FET.

The memory cell array 10 includes a plurality of memory cells (not shown) arranged in rows and columns in a row direction (Y direction) and a column direction (X direction). Each memory cell stores information of one bit. In the memory cell array, there are provided word lines (not shown) corresponding to respective rows and bit lines BL [0] to BL [127] corresponding to respective columns. Also, the number of bit lines is only an example and not restrictive.

The I/O circuit 11 is an interface for executing input of writing data and output of reading data between the internal bus 5 and the memory cell array 10 shown in FIG. 1. In FIG. 2, there is shown only a circuit portion for inputting the writing data. Specifically, the I/O circuit 11 receives 128-bit data signals D [0] to D [127] from the internal bus 5 shown in FIG. 1 and outputs them to respective bit lines BL [ ] to BL [127].

As shown in FIG. 2, corresponding to each data signal D, the I/O circuit 11 includes: data buffers 31 and 33; a delay line 32; and a D type flip-flop 34. The data signal D for each bit inputted to the memory circuit 3 is further inputted to a data input node of the flip-flop 34 through the data buffer 31, the delay line 32, and the data buffer 33. The data buffer 33 is provided so as to shape the data signal having passed through the delay line 32, but is not essential. The more detailed configuration of the delay line 32 as well as the data buffers 31 and 33 will be explained in FIGS. 5 to 7. As will be described later, according to the present embodiment, the delay line 32 is formed making use of a configuration being characteristic of the fin FET.

Also, in place of the D type flip-flop 34 of FIG. 2, a D type latch circuit may be used. In response to an edge (for example, a leading edge) of the clock signal, the D type flip-flop 34 holds an input signal immediately before the edge of the clock signal. On the other hand, for example, the D type latch circuit allows a signal to pass when the clock signal is at a high level (H level), and holds an input signal immediately before the clock signal being switched to a low level (L level). (H level and L level may be reversed.) The flip-flop 34 and the latch circuit are similar in that they are logic circuits for holding the data signal D synchronously with a clock signal CLK.

The word line driver 12 activates a word line (not shown) of a row from which data are read or to which data are written. Accordingly, each memory cell of the row from which data are read or to which data are written is coupled to a corresponding bit line BL.

The control circuit 13 receives, through the internal bus 5, a control signal CS from the CPU 2 of FIG. 1 or a DMA (Direct Memory Access) controller (not shown) etc. and, based on the control signal CS, controls an overall operation of the memory circuit 3. The control signal CS includes the clock signal CLK supplied to each flip-flop 34 which is provided in the I/O circuit 11. The clock signal CLK is inputted, through a clock buffer 20 provided in the control circuit 13, to a clock input node (reference character "CKin" in FIG. 8) of each flip-flop 34.

[Problem of Timing Control]

There will be explained, below, a problem of timing control in the I/O circuit 11 of the memory circuit 3 shown in FIG. 2.

Figure 3:
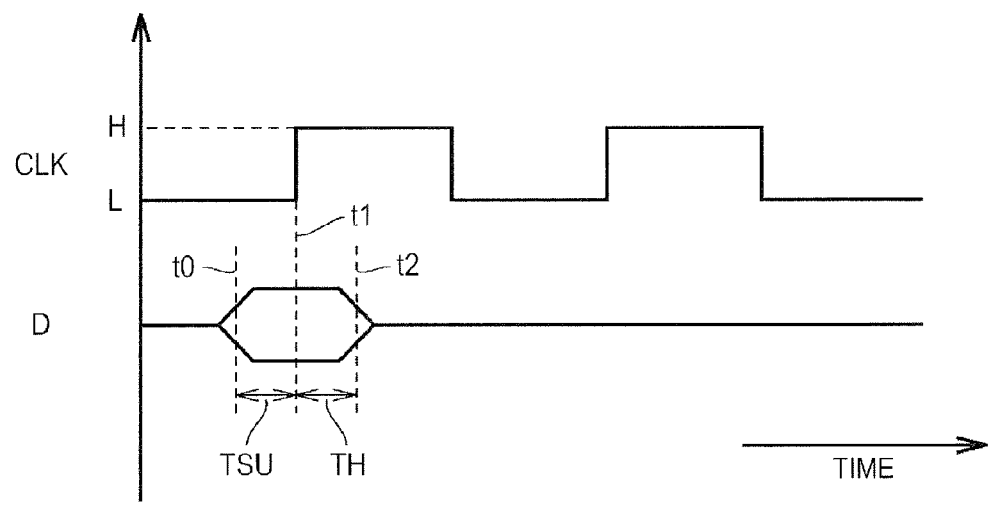
FIG. 3 is a timing chart for explaining a setup time and a hold time.

FIG. 3 is a timing chart for explaining a setup time and a hold time. In the timing chart of FIG. 3, there are shown a clock signal CLK and a data signal D to be inputted to each flip-flop 34 of FIG. 2.

Referring to FIG. 3, at a leading edge (time t1) of the clock signal CLK, the flip-flop 34 takes in the data signal D. In order to ensure the take-in of the data signal D, it is necessary to determine data a prescribed time before the leading edge of the clock signal. This time period is called a "setup time TSU (from time t0 to time t1)" of the data signal D. On the other hand, after the leading edge of the clock signal, a time period during which the data signal should be held is called a "hold time TH (from time t1 to time t2)" of the data signal D.

As shown in FIG. 2, in the I/O circuit 11 of the memory circuit 3, generally, a transmission path (clock path 25) of the clock signal CLK is longer than a transmission path (data path) of the data signal D. Therefore, as shown in Equation (1) below, the hold time TH is defined as a value found by subtracting a delay time DLY (D) of the data signal from a delay time DLY (CLK) of the clock signal.

$$TH = \text{delay (CLK)} - \text{delay}(D) \tag{1}$$

The delay time of the clock signal CLK is given by the sum of a delay time DLY (CLK; Tr) of the clock buffer 20 and a delay time DLY (CLK; wire) of the clock path of FIG. 2. On the other hand, the delay time of the data signal D is given by the sum of a delay time n×DLY (D; Tr) of data buffers 31 and 33 (where "n" is a stage number of the data buffer) and a delay time DLY (D; line) of the delay line 32. Since the delay time of the data path itself is short, it matters little. Therefore, the above Equation (1) is rewritten as Equation (2) below.

$$TH = \text{DLY (CLK;}Tr\text{)} + \text{DLY (CLK;wire)} - n \times \text{DLY} (D;Tr) - \text{DLY}(D;\text{line}) \tag{2}$$

When each of the data buffers and the flip-flop 34 are formed of fin FETs, both the increase in wiring resistance due to thinning of the wiring and the increase in parasitic capacitance between a local wiring (LIC: Local Interconnect) and the gate electrode of the fin FET affect the wiring delay DLY (CLK; wire). As a result, the data hold time TH tends to become longer than that of a commonly used planar type FET.

To cope with the above problem, when coupling data buffers 31 and 33 in numbers in series without providing the delay line 32 of FIG. 2, the circuit area will increase. Further, when the data buffers 31 and 33 are coupled in numbers in series, even if the PVT condition (process, voltage, temperature) are so set as to minimize the delay amount (called a "MIN condition"), there also arises a problem of the data hold time hardly being decreased. This problem occurs because, in the case of the MIN condition, even though both the delay time DLY (CLK; Tr) of the clock buffer and the delay time n×$_{DLY}$ (D; Tr) of the data buffer decrease, the delay time DLY (CLK; wire) of the clock path hardly decreases.

In consideration of the above aspects, according to the present embodiment, the delay line 32 is provided in a path of the data signal D of each bit. As will be explained in FIGS. 5 to 7, according to the present embodiment, area reduction of the delay line 32 is achieved by making use of the configuration being characteristic of the fin FET.

[Configuration of fin FET]

First, a configuration of the fin FET and its manufacturing method will be explained briefly.

Figure 4:
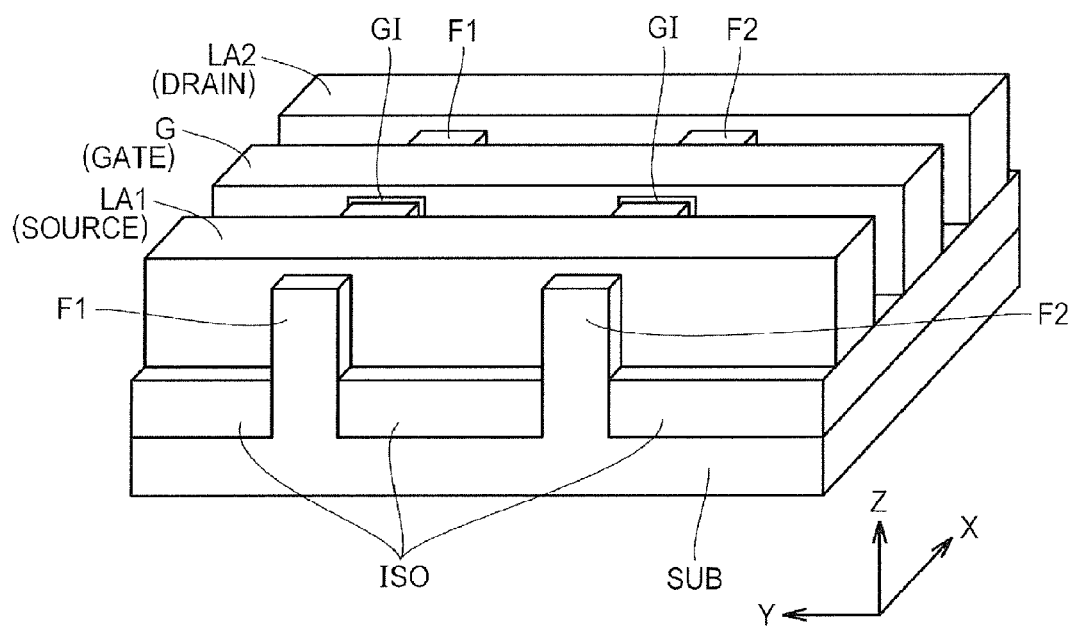
FIG. 4 is a perspective view schematically showing a configuration of a fin type field-effect transistor.

FIG. 4 is a perspective view schematically showing the configuration of the fin FET. Referring to FIG. 4, the fin FET includes, for example, a plurality of fin wirings F1 and F2 provided over a P type semiconductor substrate SUB. Each of the fin wirings F1 and F2 extends in X direction along a substrate plane. Each of the fin wirings F1 and F2 is formed by selectively etching a surface of the semiconductor substrate SUB. Between the adjacent fin wirings F (a portion where the fin wirings F1 and F2 are not formed), a silicon oxide film formed by using, for example, a CVD (Chemical Vapor Deposition) method is provided as an element isolation film ISO.

A gate electrode G is so formed as to cover upper surfaces and side surfaces of the respective fin wirings F1 and F2 through gate insulation films GI. The gate electrode G extends in Y direction, which is a direction intersecting the fin wirings F1 and F2. The gate electrode G can be formed of, for example, a semiconductor such as polycrystalline silicon, a conductive compound such as titanium nitride, and a single metal such as tungsten, or a laminated film containing any of those.

After forming the gate electrode G, by introducing impurities into the fin wirings F using the gate electrode G as a mask, a source region and a drain region (not shown) are formed in portions other than a channel region surrounded by the gate electrode G. In this regard, when providing a PMOS (P-channel Metal Oxide Semiconductor) transistor, the fin wirings F are formed over an N type well and P type impurities are introduced into the fin wirings F. On the other hand, when providing an NMOS (N-channel Metal Oxide Semiconductor) transistor, the fin wirings F are formed over a P type substrate or a P type well and N type impurities are introduced into the fin wirings F.

So as to be in ohmic contact with upper surfaces and side surfaces of the source region and the drain region, using a single metal such as tungsten, local wirings (LIC: Local Inter-Connect) LA1 and LA2 extending in Y direction are formed, respectively. That is, the local wirings LA1 and LA2 function as a source electrode and a drain electrode, respectively. Gate wirings G, the source electrode LA1, and the drain electrode LA2 are, further, directly coupled to the local wirings (not shown) extending in X direction or coupled to an upper metal wiring layer (not shown) through a via hole formed in an interlayer insulation layer (not shown).

[Configuration of Delay Line and Data Buffer]

Based on the above configuration of the fin FET, the data buffers 31 and 33, the delay line 32, and the flip-flop 34 shown in FIG. 2 are formed.

Figure 5:
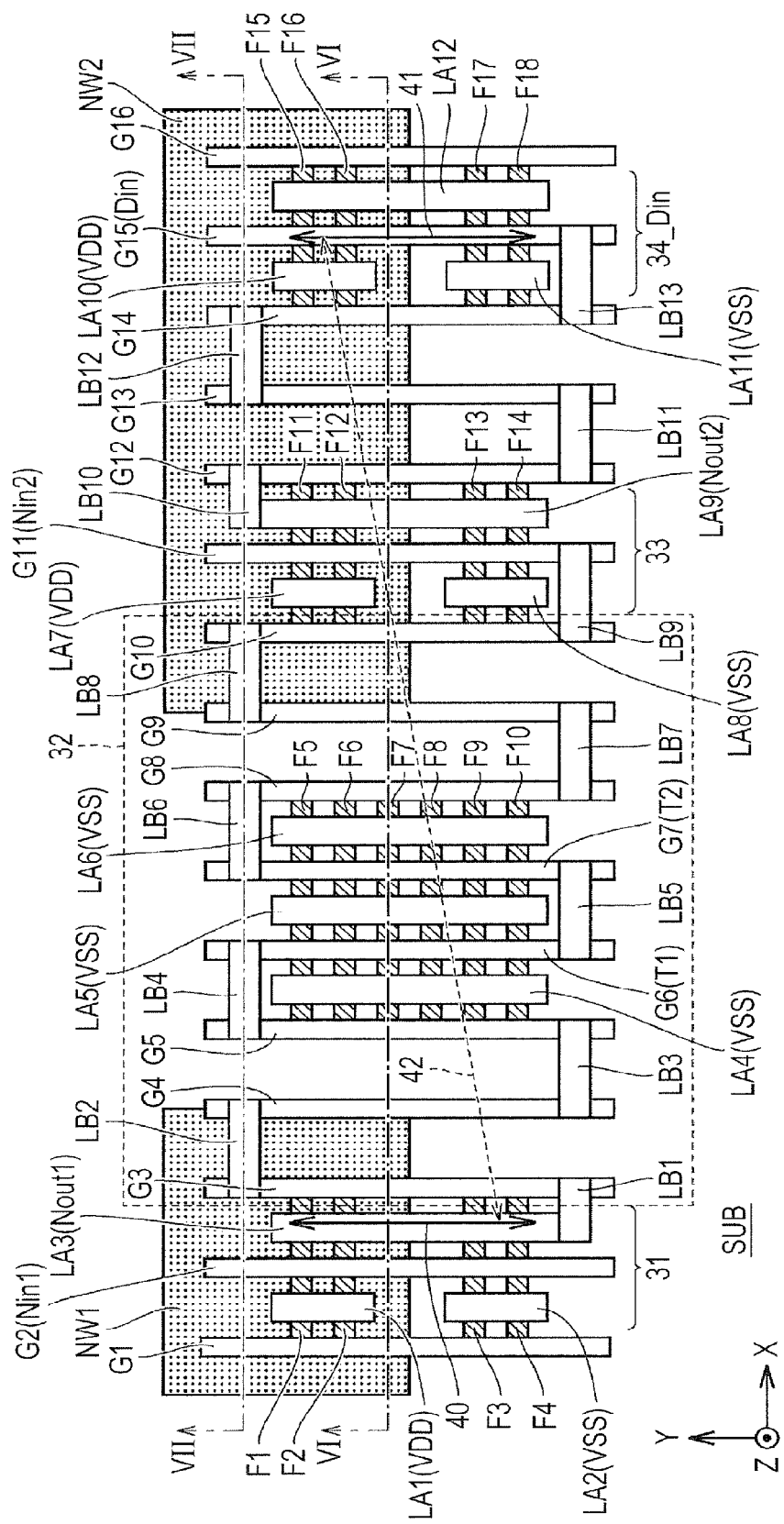
FIG. 5 is a plan view showing specific configurations of data buffers, a delay line, and a data input part of a flip-flop shown in FIG. 2.
Figure 6:
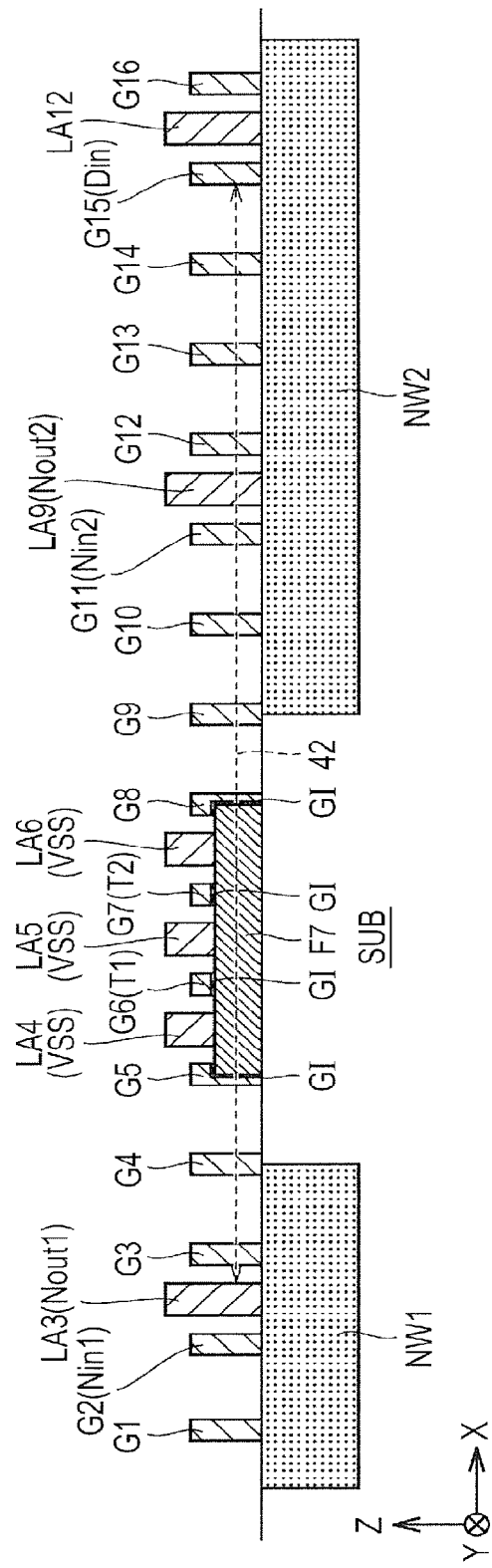
FIG. 6 is a cross-sectional view taken along line VI-VI of FIG. 5.
Figure 7:
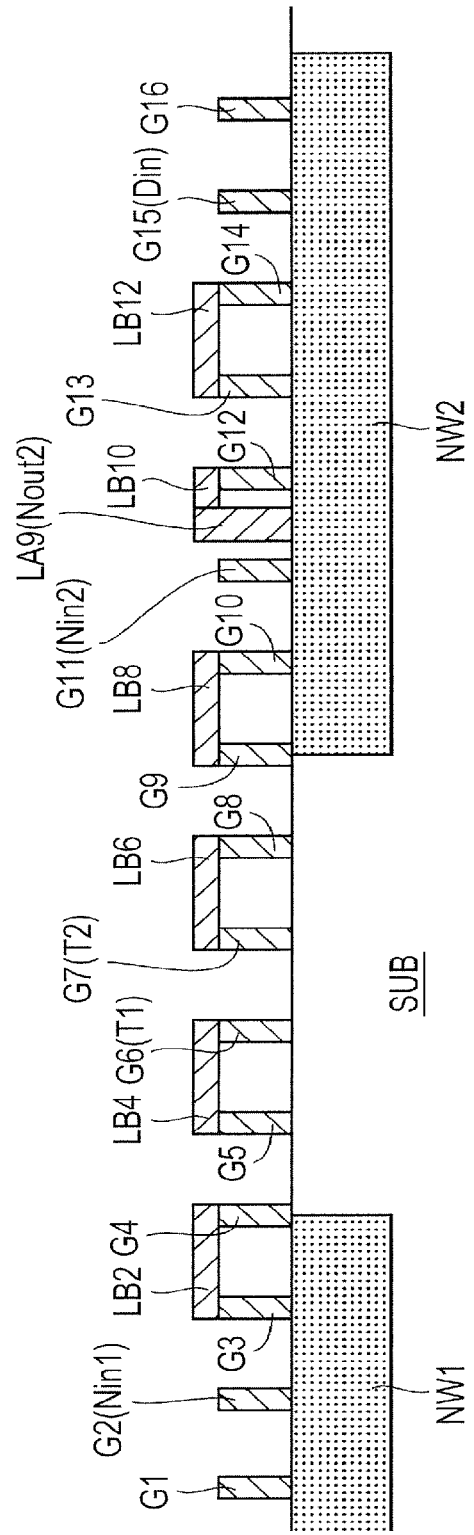
FIG. 7 is a cross-sectional view taken along line VII-VII of FIG. 5.
Figure 8:
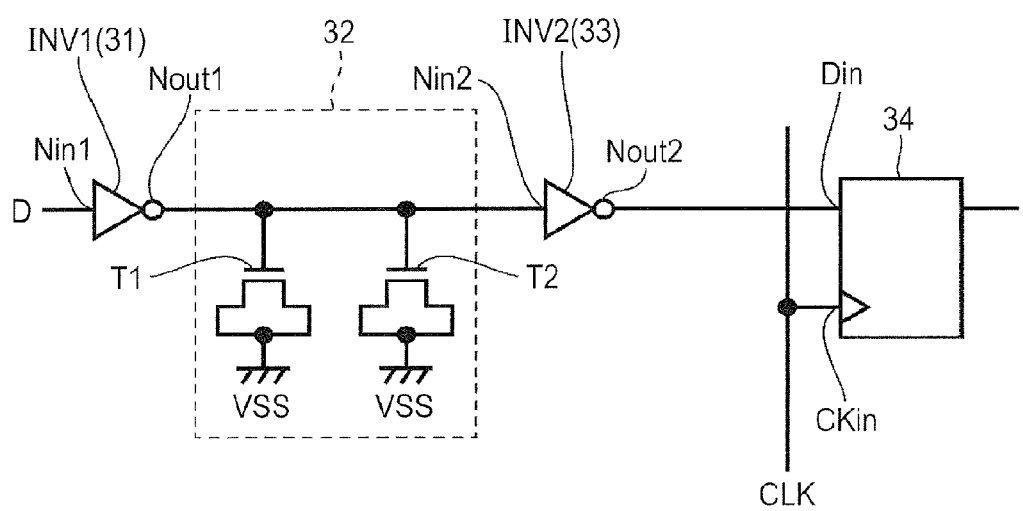
FIG. 8 is an equivalent circuit diagram of the data buffers 31 and 33 and the delay line 32 shown in FIG. 5.

FIG. 5 is a plan view showing specific configurations of the data buffers, the delay line, and a data input part of the flip-flop shown in FIG. 2. FIG. 6 is a cross-sectional view taken along line VI-VI of FIG. 5. FIG. 7 is a cross-sectional view taken along line VII-VII of FIG. 5. FIG. 8 is an equivalent circuit diagram of the data buffers 31 and 33 and the delay line 32 shown in FIG. 5. In FIGS. 5 to 7, as the data input part of the flip-flop 34, a CMOS inverter formed of a PMOS transistor and an NMOS transistor is shown. In the plan view of FIG. 5, in order to make the drawing intelligible, hatching of slanting line patterns is attached to fin wirings F1 to F18, and hatching of dot patterns is attached to the N type wells NW1 and NW2. In FIGS. 5 to 7, directions in a substrate plane are referred to as "X direction" and "Y direction," and a direction perpendicular to the substrate is referred to as "Z direction."

Referring to FIGS. 5 to 7, over the P type semiconductor substrate SUB (including regions of the N type wells NW1 and NW2), a plurality of fin wirings F1 to F18 each extending in X direction are formed. In order to make patterning more accurate, the fin wirings F1 to F18 have equal widths and are basically arranged at regular intervals. There is also part of the region over the substrate where no fin wiring is formed. The fin wirings F1 and F2 used as PMOS transistors are formed over the N type well NW1. Likewise, the fin wirings F11, F12, F15, and F16 used as PMOS transistors are formed over the N type well NW2.

A plurality of gate wirings G1 to G16 are so formed as to extend, respectively, in Y direction intersecting an extending direction (X direction) of the fin wirings F1 to F18. In order to make patterning more accurate, the gate wirings G1 to G16 have equal widths and are arranged in X direction at regular intervals. The gate insulation films GI are placed between the gate wirings G1-G3, G5-G8, G10-G12, G14-G16 and the fin wirings F.

The gate wirings G1 to G16 include those which are used as gate electrodes of the fin FET (G2, G11, and G15), those which are used as local wirings only (G1, G3, G4, G5, G8, G9, G10, G12, G13, G14, and G16), and those which are used as both the gate electrode and the local wiring (G6 and G7). In FIGS. 5 and 6, the gate wirings used as the local wirings only, such as G1, G3, G5, G8, G10, G12, G14, and G16, are also coupled to the fin wirings F through the gate insulation films GI. However, these gate wirings do not necessarily have to be coupled to the fin wirings electrically.

Between adjacent gate wirings G, the local wirings LA1 to LA9 are so provided, respectively, as to cover part of the fin wirings F and are in ohmic contact with the fin wirings F. Each of the local wirings LA1 to LA9 is so formed as to extend in Y direction (along the extending direction of the gate wirings G).

Between the adjacent gate wirings G and the local wirings LA as well as between the adjacent gate wirings G, there are filled insulation films (not shown) such as silicon oxide films formed by using the CVD method. Each of the local wirings LB1 to LB9 is formed above the filled insulation film so as to extend in X direction. Each of the local wirings LB1 to LB9 extending in X direction couples the adjacent gate wirings G or the adjacent gate wirings G and the local wirings LA extending in Y direction. In this case, each local wiring LB is directly coupled with the local wiring LA (that is, without passing through a via hole formed in the interlayer insulation layer). The local wirings LB are also directly coupled, respectively, with the gate wirings G (without passing through a via hole formed in the insulation layer).

For example, in FIG. 7, the local wiring LB2 is directly coupled to upper surfaces of the gate wirings G3 and G4. The local wiring LB4 is directly coupled to upper surfaces of the gate wirings G5 and G6. The local wiring LB6 is directly coupled to upper surfaces of the gate wirings G7 and G8. The local wiring LB8 is directly coupled to upper surfaces of the gate wirings G9 and G10. The local wiring LB10 is directly coupled to a side surface of the local wiring LA9 extending in Y direction and is also directly coupled to an upper surface of the gate wiring G12. The local wiring LB12 is directly coupled to upper surfaces of the gate wirings G13 and G14.

As shown in FIG. 8, the inverters INV1 and INV2 are used as data buffers 31 and 33, respectively. Referring to FIGS. 5 to 7, the inverter INV1 (data buffer 31) includes: fin wirings F1 to F4; the gate wiring G2; and the local wirings LA1 to LA3. The fin wirings F1 and F2 are used as a channel region, a source region, and a drain region of a PMOS transistor for forming the inverter INV1. The local wiring LA1 is used as a source electrode of the PMOS transistor, and is coupled to a power supply wiring (not shown) provided in an upper metal wiring layer through a via hole (not shown) formed in the interlayer insulation layer (not shown). As a result, a power supply potential VDD is given to the local wiring LA1.

Likewise, the fin wirings F3 and F4 are used as a channel region, a source region, and a drain region of an NMOS transistor for forming the inverter INV1. The local wiring LA2 is used as a source electrode of the NMOS transistor, and is coupled to a ground wiring (not shown) provided in the upper metal wiring layer through a via hole (not shown) formed in the interlayer insulation layer (not shown). As a result, a ground potential VSS is given to the local wiring LA1. The gate wiring G2 corresponds to a data input node Nin1 of the inverter INV1 shown in FIG. 8, and is shared, as agate electrode, between the PMOS transistor and the NMOS transistor forming the inverter INV1. The local wiring LA3 (in particular, a portion from the fin wiring F1 to the fin wiring F4 shown by arrow 40 in FIG. 5) corresponds to a data output node Nout1 of the inverter INV1 shown in FIG. 8, and is shared between the PMOS transistor and the NMOS transistor as a drain electrode.

The inverter INV2 (data buffer 33) includes fin wirings F11 to F14, the gate wiring G11, and the local wirings LA7 to LA9. The fin wirings F11 and F12 are used as a channel region, a source region, and a drain region of a PMOS transistor for forming the inverter INV2. The local wiring LA7 is used as a source electrode of the PMOS transistor, and is coupled to the power supply wiring (not shown) provided in the upper metal wiring layer through a via hole (not shown) formed in the interlayer insulation layer (not shown). As a result, the power supply potential VDD is given to the local wiring LA7.

Likewise, the fin wirings F13 and F14 are used as a channel region, a source region, and a drain region of an NMOS transistor for forming the inverter INV2. The local wiring LA8 is used as a source electrode of the NMOS transistor, and is coupled to the ground wiring (not shown) provided in the upper metal wiring layer through a via hole (not shown) formed in the interlayer insulation layer (not shown). As a result, the ground potential VSS is given to the local wiring LA7. The gate wiring G11 corresponds to a data input node Nin2 of the inverter INV2 shown in FIG. 8, and is shared between the PMOS transistor and the NMOS transistor as a gate electrode. The local wiring LA9 corresponds to a data output node Nout2 of the inverter INV2 shown in FIG. 8, and is shared between the PMOS transistor and the NMOS transistor as a drain electrode.

FIG. 5 further shows an inverter 34_Din for forming the input part of the flip-flop 34. The inverter 34_Din for forming the input part includes fin wirings F15 to F18, the gate wiring G15, and local wirings LA10 to LA12. The fin wirings F15 and F16 are used as a channel region, a source region, and a drain region of a PMOS transistor for forming the inverter 34_Din. The local wiring LA10 is used as a source electrode of the PMOS transistor, and is coupled to the power supply wiring (not shown) provided in the upper metal wiring layer through a via hole (not shown) formed in the interlayer insulation layer (not shown). As a result, the power supply potential VDD is given to the local wiring LA10.

Likewise, the fin wirings F17 and F18 are used as a channel region, a source region, and a drain region of an NMOS transistor for forming the inverter 34_Din. The local wiring LA11 is used as a source electrode of the NMOS transistor, and is coupled to the ground wiring (not shown) provided in the upper metal wiring layer through a via hole (not shown) formed in the interlayer insulation layer (not shown). As a result, the ground potential VSS is given to the local wiring LA11. The gate wiring G15 (in particular, a portion from the fin wiring F15 to the fin wiring F18 shown by arrow 41 in FIG. 5) corresponds to a data input node Din of the flip-flop 34 shown in FIG. 8, and is shared between the PMOS transistor and the NMOS transistor as a gate electrode.

The delay line 32 is provided between the data output node Nout1 (local wiring LA3) of the above inverter INV1 (data buffer 31) and the data input node Nin2 (gate wiring G11) of the inverter INV2 (data buffer 33). The delay line 32 includes the gate wirings G3 to G10 and the local wirings LB2 to LB8 for coupling adjacent gate wirings. The gate wiring G3 is coupled to the data output node Nout1 (local wiring LA3) of the inverter INV1 (data buffer 31) through the local wiring LB1. The gate wiring G10 is coupled to the data input node Nin2 (gate wiring G11) of the inverter INV2 (data buffer 33) through the local wiring LB9. Therefore, data signals are transmitted through the local wiring LB1, the gate wiring G3, the local wiring LB2, the gate wiring G4, the local wiring LB3, the gate wiring G5, the local wiring LB4, the gate wiring G6, the local wiring LB5, the gate wiring G7, the local wiring LB6, the gate wiring G8, the local wiring LB7, the gate wiring G9, the local wiring LB8, the gate wiring G10, and the local wiring LB9, in this order.

With this regard, a path of the data signal D from the data output node Nout1 (a portion of the local wiring LA3 indicated by arrow 40) of the output buffer 31 (inverter INV1) to the data input node Din (a portion of the gate wiring G15 indicated by arrow 41) of the flip-flop 34 passes through the gate wirings G3 to G14 and the local wirings LB1 to LB13. Therefore, as seen in a plane of the semiconductor substrate SUB from a direction perpendicular to the substrate (Z direction), a path length of the data signal D from the data output node Nout1 to the data input node Din is longer than a straight path 42 joining the data output node Nout1 and the data input node Din. As shown in FIG. 6, the straight path 42 extends from a right end (+X direction side) of the local wiring LA3 to a left end (−X direction side) of the gate wiring G15. As shown in FIG. 5, the straight path 42 is not limited to the path along X direction and it can be along an oblique direction (or can be along any direction as long as it is a straight line passing through the portions indicated by arrow 40 and arrow 41).

Further, preferably, as shown in FIG. 8, the delay line 32 is coupled with the ground node (ground wiring), which gives the ground potential VSS, through capacitive elements T1 and T2. The delay time made by the delay line 32 can be further increased by a CR delay brought about by the capacitive elements.

The capacitive elements T1 and T2 are formed by making use of gate capacitance of fin FETs. Specifically, as shown in FIGS. 5 and 6, a fin FET being the capacitive element T1 includes: the fin wirings F5 to F10; the gate wiring G6 used as a gate electrode; and the local wirings LA4 and LA5 used as a source electrode and a drain electrode. On the other hand, a fin FET being the capacitive element T2 includes: the fin wirings F5 to F10; the gate wiring G7 used as a gate electrode; and the local wirings LA5 and LA6 used as a source electrode and a drain electrode. The fin wirings F5 to F10 and the local wiring LA5 are shared by both the fin FETs. The local wirings LA4 to LA6 are coupled to the ground wiring (not shown) provided in the upper metal wiring layer through a via hole (not shown) formed in the interlayer insulation layer (not shown). As a result, the ground potential VSS is given to the local wirings LA4 to LA6.

Effects of First Embodiment

As described above, the wiring length of the data path can be made longer by providing the delay line 32 in the path of the data signal D and by forming the delay line 32 including the gate wirings G. Compared with a case of a commonly used method where a delay time is adjusted by data buffers only, the whole circuit area can be made smaller.

It is desirable that the gate wiring G be formed with use of a metal material such as tungsten. The voltage and temperature dependency of the delay time of the metal gate wiring is a characteristic similar to that of the metal wiring in the upper layer. Therefore, the PVT (process, voltage, temperature) dependency of the data hold time can be made greater. Hereafter, detailed explanation thereof will be given with reference to simulation results shown in FIGS. 9 and 10.

Figure 10:
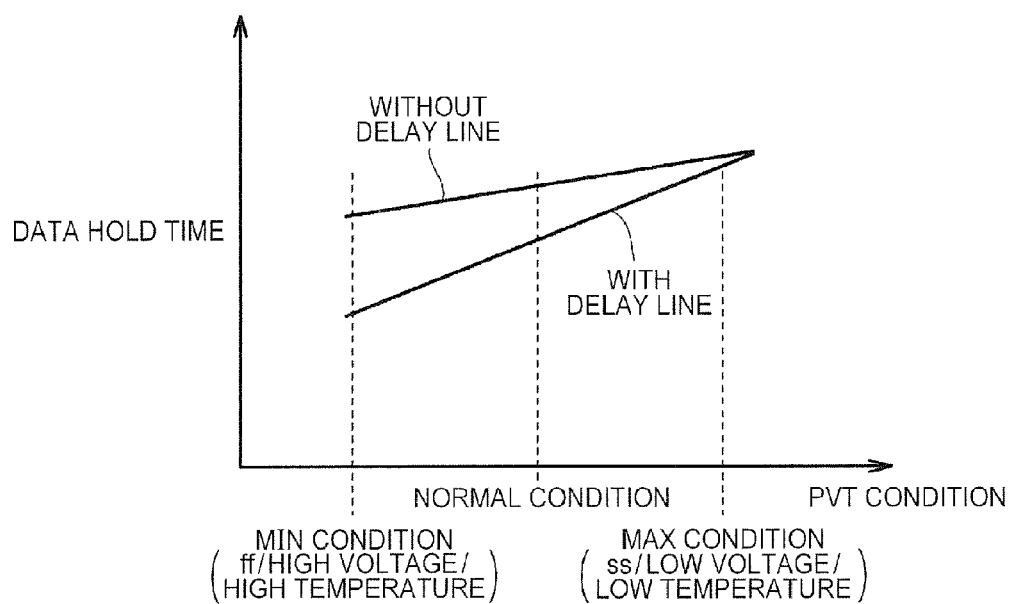
FIG. 10 schematically shows a relationship between the data hold time and the PVT condition.

FIG. 9 shows, in tabular form, a simulation result of the data setup time and the data hold time. FIG. 10 schematically shows a relationship between the data hold time and the PVT condition. In FIGS. 9 and 10, there are compared a case where the delay line 32 explained in FIGS. 5 to 8 is provided and a case where data buffers are provided in place of the delay line.

Referring to FIGS. 9 and 10, the MIN condition is a condition where the delay of the data signal becomes minimum. Specifically, in the case of the MIN condition, the process condition of the semiconductor device is that switching speed of the PMOS transistor and the NMOS transistor becomes highest (the drain current becomes greatest). The operating condition of the semiconductor device is: high voltage (0.88V) and high temperature (125° C.). The MAX condition is a condition where the delay of the data signal becomes maximum. Specifically, in the case of the MAX condition, the process condition of the semiconductor device is that the switching speed of the PMOS transistor and the NMOS transistor becomes lowest (the drain current becomes smallest). The operating condition of the semiconductor device is: low voltage (0.72V) and low temperature (−40° C.).

As shown in FIG. 9, when the delay circuit is formed by coupling data buffers in numbers in series without using the above delay line 32, even if the PVT condition is switched from the MAX condition to the MIN condition, the data hold time (difference between the delay time of the clock path and the delay time of the data path) decreases only to 88%. On the other hand, when the PVT condition is switched from the MAX condition to the MIN condition, with use of the delay line 32 of the present embodiment, the data hold time decreases to 54%.

As described above, according to the semiconductor device of the present embodiment, the delay time of the data path, which used to be increased by using data buffers in numbers in the commonly used method, is increased by providing the delay line 32 (i.e., by lengthening the wiring of the data path) in place of the data buffers. In this way, when the PVT condition is set to the MIN condition also, the delay time of the data path is not greatly decreased, offsetting the wiring delay of the clock path. As a result, the data hold time can be shortened.

Also, as compared to the case where the delay circuit is formed by coupling data buffers in numbers in series, the number of the data buffers can be decreased with use of the above delay line 32, which makes it possible to reduce the circuit area. In particular, according to the present embodiment, further area reduction is achieved by using, for the delay line 32, the gate wirings G which are in the same wiring layer as the gate electrodes to be used in the fin FET.

Second Embodiment

Figure 11:
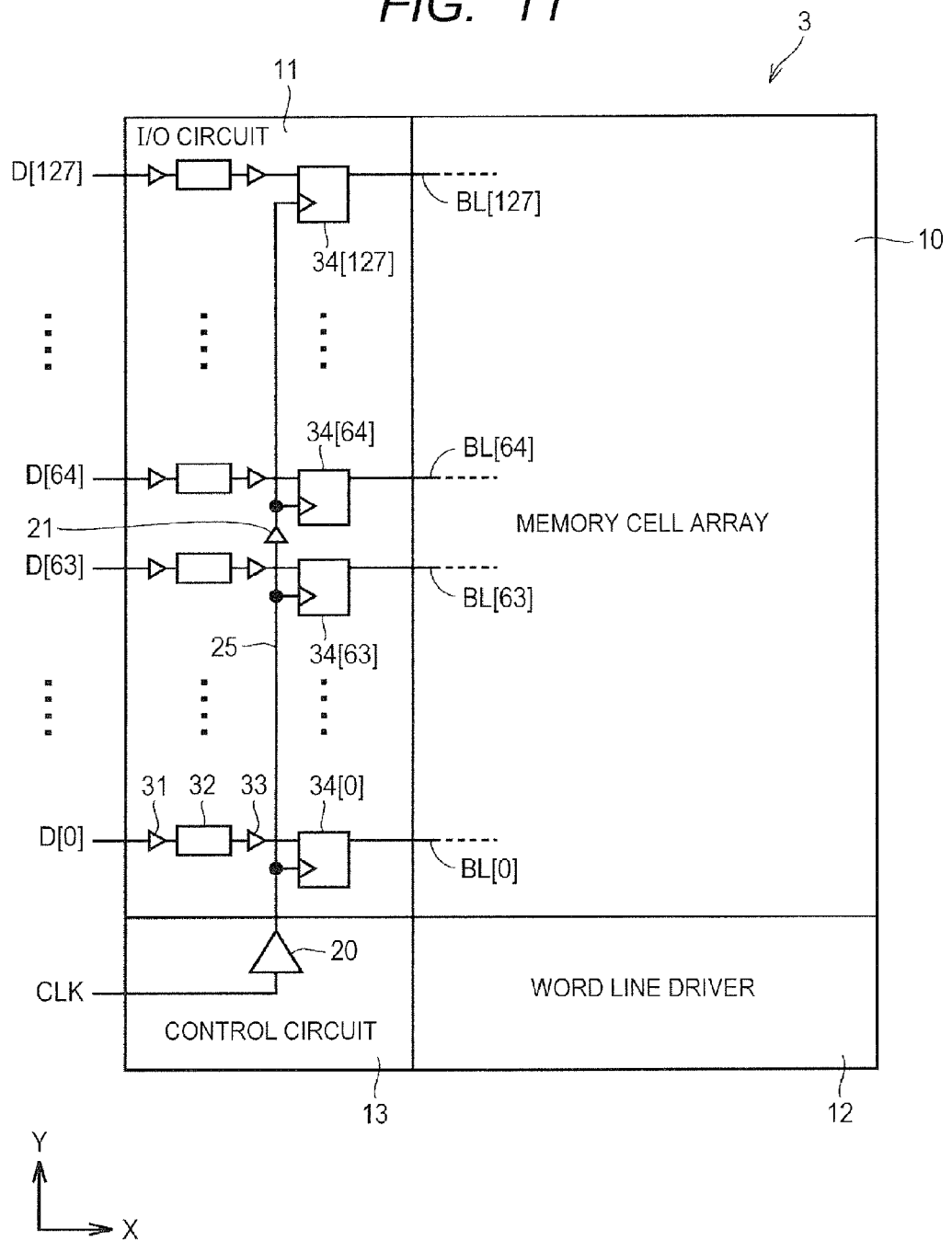
FIG. 11 is a block diagram showing a configuration of a memory circuit in a semiconductor device according to Second Embodiment.

FIG. 11 is a block diagram showing a configuration of a memory circuit in a semiconductor device according to Second Embodiment. An I/O circuit 11 in the memory circuit 3 of FIG. 11 differs from the I/O circuit 11 of FIG. 2 in that a repeater buffer 21 is provided midway of a clock path 25 for transmission of the clock signal CLK. Specifically, in FIG. 11, the repeater buffer 21 is provided between a flip-flop 34 [63] for a data signal D [63] and a flip-flop 34 [64] for a data signal D [64]. The clock signal CLK shaped by the clock buffer 20 is further shaped by the repeater buffer 21. Since other aspects shown in FIG. 11 are substantially the same as those in FIG. 2, the same or corresponding parts are denoted by the same reference characters and description thereof is not repeated.

By providing the repeater buffer 21, the number of flip-flops 34 to be driven by the clock buffer 20 is reduced in half and a wiring length of the clock path 25 is also reduced in half. The remaining half of the flip-flops 34 and the half of the clock path 25 are driven by the repeater buffer 21. Therefore, even if the gate delay of the repeater buffer 21 increases, the wiring delay and parasitic capacitance caused by the gate of the transistor can be reduced more than that. Consequently, the delay time of the clock signal of the whole transmission path can be further decreased.

In Equation (2) described above, by decreasing the delay time DLY (CLK; wire) of the clock path, the data hold time can be more shortened when the PVT condition is set to the MIN condition. In addition, when the delay time of the clock path is shortened, the delay time of the data path made by the delay line 32 can be shortened accordingly, which allows an area of each delay line 32 to be further reduced.

Third Embodiment

Figure 12:
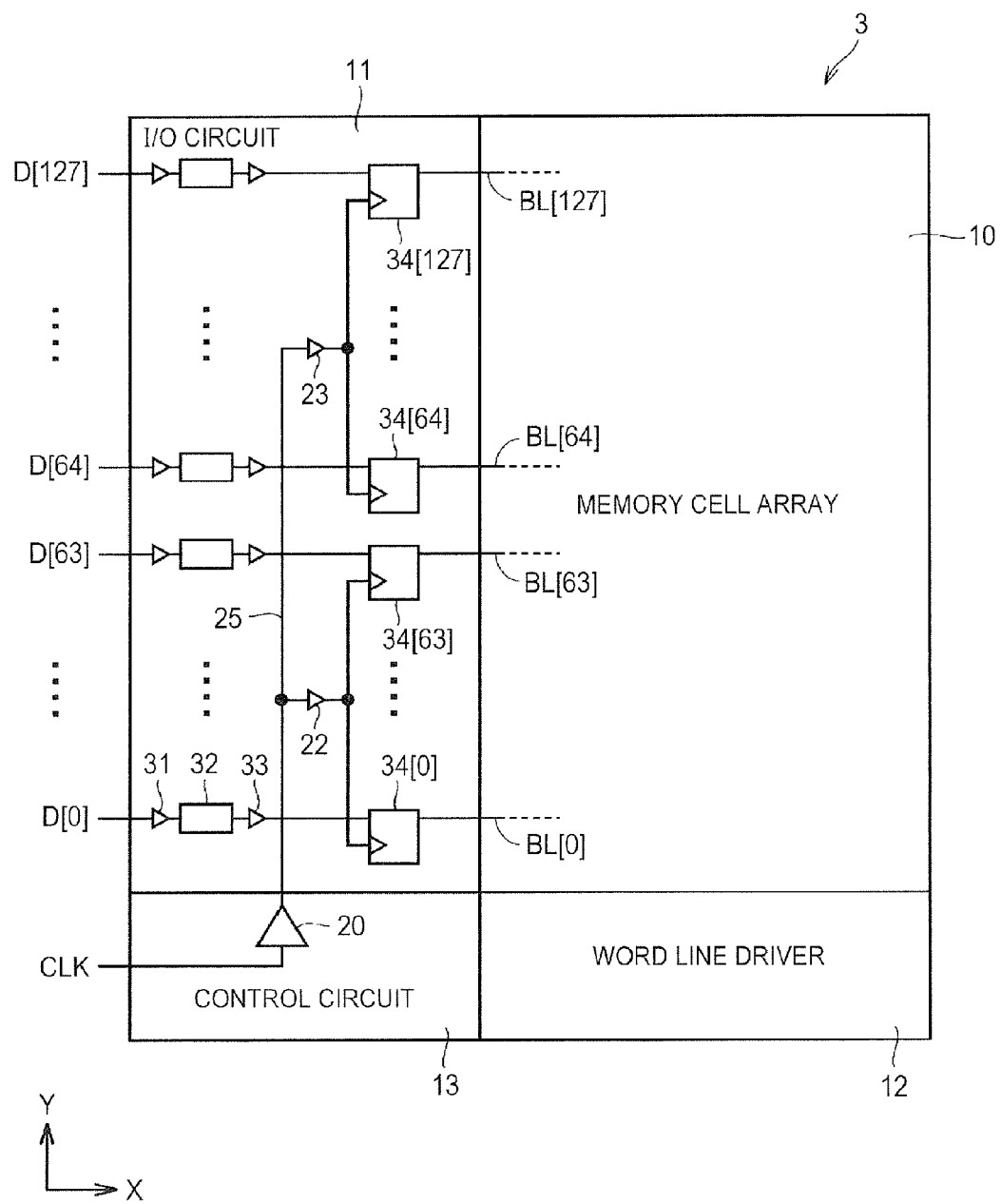
FIG. 12 is a block diagram showing a configuration of a memory circuit in a semiconductor device according to Third Embodiment.

FIG. 12 is a block diagram showing a configuration of a memory circuit in a semiconductor device according to Third Embodiment. An I/O circuit 11 in the memory circuit 3 of FIG. 12 differs from the I/O circuit 11 of FIG. 2 in that the clock path 25 is in a tree-like shape. That is, according to Third Embodiment, clock signals CLK are inputted to a plurality of flip-flops 34 [0] to 34 [127] through the tree-like signal path. A repeater buffer is provided at a branch point of the clock signal CLK.

In the case of FIG. 12, specifically, the clock path is branched into two. One clock path is coupled to a clock input node of each of flip-flops 34 [0] to 34 [63] through a repeater buffer 22. The other clock path is coupled to a clock input node of each of flip-flops 34 [64] to 34 [127] through the repeater buffer 22. Since other aspects shown in FIG. 12 are substantially the same as those shown in FIG. 2, the same or corresponding parts are denoted by the same reference characters and description thereof is not repeated.

By providing repeater buffers 22 and 23, as in the case of Second Embodiment, the delay time of the clock signal of the whole transmission path can be decreased. Therefore, when the PVT condition is set to the MIN condition, the data hold time can be made shorter. When the delay time of the clock path is shortened, in accordance with it, the delay time of the data path made by the delay line 32 can be shortened, which allows the area of each delay line 32 to be reduced.

Also, by forming the clock path in the tree-like shape, the length of the clock path from the clock buffer 20 to a clock input node of each flip-flop 34 can be uniform. Therefore, since the delay time of the clock signal for each flip-flop 34 can be made uniform, the data hold time can be improved.

Fourth Embodiment

Figure 13:
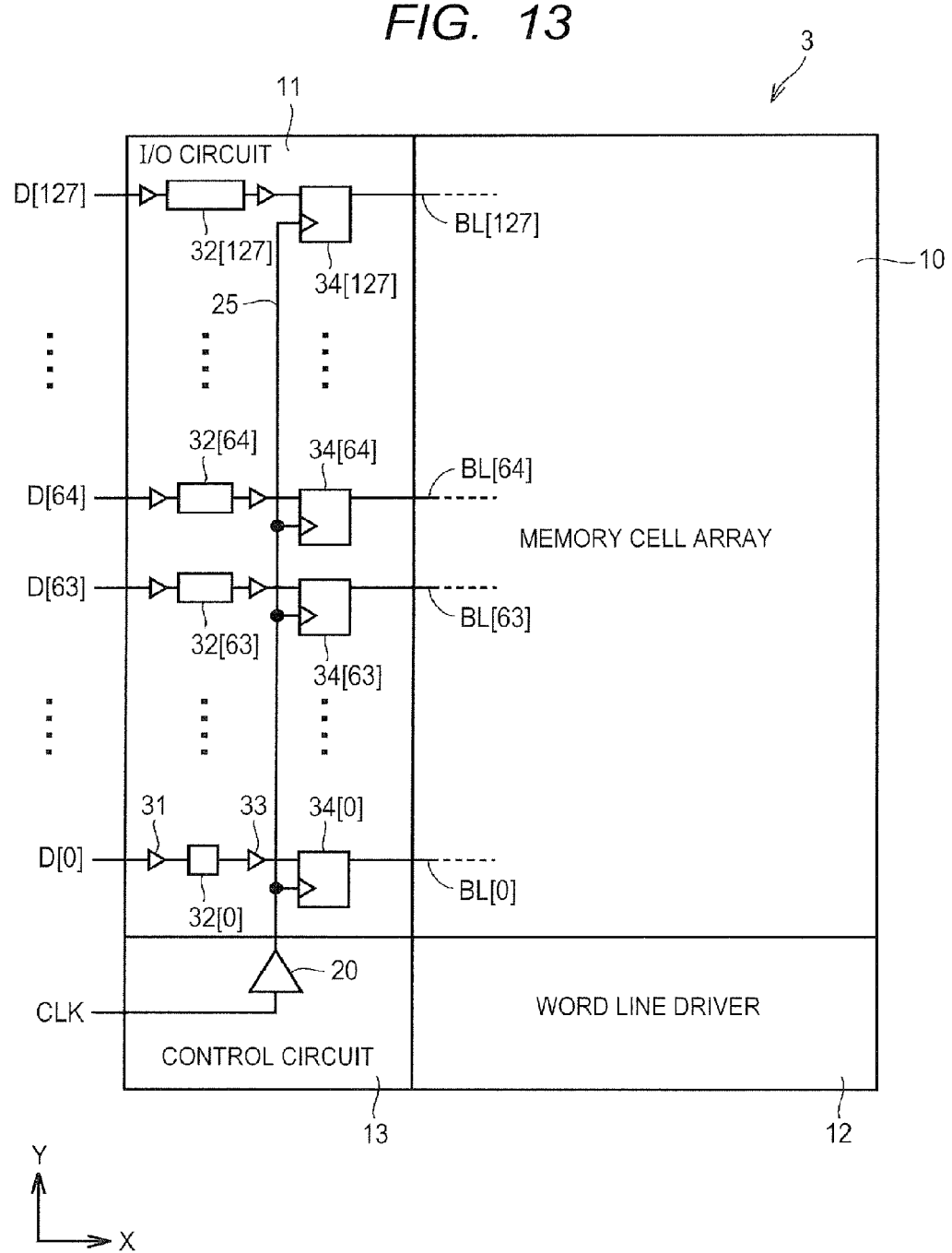
FIG. 13 is a block diagram showing a configuration of a memory circuit in a semiconductor device according to Fourth Embodiment.

FIG. 13 is a block diagram showing a configuration of a memory circuit in a semiconductor device according to Fourth Embodiment. An I/O circuit 11 in the memory circuit 3 of FIG. 13 differs from the I/O circuit 11 of FIG. 2 in that the longer a path length of the clock signal from the data output node of the clock buffer 20 to the clock input node of each flip-flop 34 is, the longer the delay time of the delay line 32 coupled to the data output node is made. Specifically, in the case shown in FIG. 13, the delay time of the delay line 32 [127] for the data signal D [127] is the longest and the delay time of the delay line 32 [0] for the data signal D [0] is the shortest. The longer a path length of the delay line is set, or the greater the number or capacitance of capacitive elements to be coupled is, the longer the delay time of the delay line 32 becomes. Since other aspects shown in FIG. 13 are substantially the same as those shown in FIG. 2, the same or corresponding parts are denoted by the same reference characters and description thereof is not repeated.

The longer the path length from the clock output node of the clock buffer 20 is, the longer the delay time of the clock signal inputted to each flip-flop 34 becomes. Accordingly, by increasing the delay time of the data signal in response to the delay time of the clock signal, the data hold time can be more decreased.

Hereinbefore, the invention made by the inventors has been specifically explained based on the embodiments, but the present invention is not limited to the above-described embodiments, and it is needless to say that various changes can be made without departing from the gist of the invention.

What is claimed is:

1. A semiconductor device comprising:
a first inverter including a first data input node and a first data output node; and
a logic circuit including a second data input node coupled to the first data output node and a clock input node coupled to a clock path wiring,
wherein the first inverter includes a first p-channel transistor and a first n-channel transistor, each comprised of a fin type field-effect transistor,
wherein the first p-channel and first n-channel transistors are coupled to a first gate wiring for the first data input node,
wherein the first gate wiring is formed on a plurality of first projection semiconductor layers,
wherein the first p-channel and first n-channel transistors are coupled to a first local wiring for the first data output node,
wherein the first local wiring is formed on the first projection semiconductor layers,
wherein the logic circuit includes a second inverter including a second p-channel transistor and a second n-channel transistor, each comprised of a fin type field-effect transistor,
wherein the second p-channel and second n-channel transistors are coupled to a second gate wiring for the second data input node,
wherein the second gate wiring is formed on a plurality of second projection semiconductor layers,
wherein the first and second projection semiconductor layers extend along a first direction,
wherein the first and second gate wirings and the first local wiring extend along a second direction perpendicular to the first direction,
wherein a plurality of connection wirings includes a plurality of first connection wirings and a plurality of second connection wirings coupled in series, respectively,
wherein the first connection wirings extend in the second direction and the second connection wirings extend in the first direction,
wherein the connection wirings are coupled to the first data output node of the first inverter and the second data input node of the second inverter, and arranged between the first data output node of first inverter and the second data input node of the second inverter such that the first local wiring is coupled to one end of the connection wirings and the second gate wiring is coupled to another end of the connection wirings,
wherein the first and second gate wirings and the first connection wirings are arranged at a same layer, and
wherein, in plan view, a length of a straight path from the first local wiring to the second gate wiring, extending along the first direction, is less than the sum of a total length of the first connection wirings in the second direction and a total length of the second connection wirings in the first direction.

2. The semiconductor device according to claim 1,
wherein the second connection wirings are arranged over the first connection wirings.

3. The semiconductor device according to claim 2, further comprising:
a capacitive element coupled to the connection wirings.

4. The semiconductor device according to claim 3,
wherein the capacitive element is coupled to a plurality of first voltage wirings formed on a plurality of third projection semiconductor layers as source or drain electrodes of the capacitive element,
wherein the capacitive element is coupled to one of the first connection wirings formed on the third projection semiconductor layers as a gate electrode of the capacitive element and arranged between the first voltage wirings, and
wherein the capacitive element is formed by making use of gate capacitance.

5. The semiconductor device according to claim 4,
wherein the first voltage wirings extend along the second direction.

6. The semiconductor device according to claim 5,
wherein the first voltage wirings are supplied with a ground potential voltage.

7. The semiconductor device according to claim 3, further comprising:
a third inverter including a third p-channel transistor and a third n-channel transistor, each comprised of a fin type field-effect transistor,
wherein the third p-channel and third n-channel transistors are coupled to a third gate wiring formed on a plurality of fourth projection semiconductor layers for a third data input node,
wherein the third p-channel and third n-channel transistors are coupled to a second local wiring formed on the fourth projection semiconductor layers for a second data output node, and
wherein the third inverter is arranged between the connection wirings and the logic circuit such that the third gate wiring is coupled to the another end of the connection wirings and the second local wiring is coupled to the second gate wiring.

8. The semiconductor device according to claim 2,
wherein the logic circuit includes a D type flip-flop or a D type latch circuit.

9. The semiconductor device according to claim 8, comprising:

a memory circuit including a memory array and an input/output circuit, wherein the memory array includes a plurality of memory cells, wherein the first inverter, the logic circuit and the connection wirings are disposed in the input/output circuit, and wherein the logic circuit receives a data signal via the second data input node and a clock signal via the clock input node, and provides the data signal to the memory cells.

10. The semiconductor device according to claim 1, wherein the straight path extends in the first direction.

11. The semiconductor device according to claim 1, wherein the straight path is oblique to the first direction.

* * * * *